United States Patent
Miyakoshi et al.

(10) Patent No.: US 8,841,724 B2
(45) Date of Patent: Sep. 23, 2014

(54) SEMICONDUCTOR DEVICE AND ITS MANUFACTURING METHOD

(75) Inventors: Kenji Miyakoshi, Ome (JP); Shinichiro Wada, Fuchu (JP); Yohei Yanagida, Hamura (JP); Takayuki Oshima, Ome (JP); Keigo Kitazawa, Hino (JP)

(73) Assignee: Hitachi, Ltd., Tokyo (JP)

( * ) Notice: Subject to any disclaimer, the term of this patent is extended or adjusted under 35 U.S.C. 154(b) by 543 days.

(21) Appl. No.: 12/980,675

(22) Filed: Dec. 29, 2010

(65) Prior Publication Data
US 2011/0215401 A1 Sep. 8, 2011

(30) Foreign Application Priority Data
Mar. 2, 2010 (JP) .................. 2010-044861

(51) Int. Cl.
*H01L 29/772* (2006.01)

(52) U.S. Cl.
CPC .................. *H01L 29/772* (2013.01)
USPC ............. 257/340; 257/341; 257/343

(58) Field of Classification Search
CPC ...... H01L 29/0633–29/0634; H01L 29/66659; H01L 29/7816; H01L 29/7835
USPC ................................. 257/335–346
See application file for complete search history.

(56) References Cited

U.S. PATENT DOCUMENTS

| 5,731,603 A | 3/1998 | Nakagawa et al. | |
| 6,614,075 B2* | 9/2003 | Akaishi et al. | 257/336 |
| 7,087,973 B2* | 8/2006 | Mallikarjunaswamy et al. | 257/493 |
| 8,017,486 B2* | 9/2011 | Huang et al. | 257/345 |
| 8,212,329 B2* | 7/2012 | Mallikarjunaswamy et al. | 257/492 |

FOREIGN PATENT DOCUMENTS

| JP | 11-266018 A | 9/1999 |
| JP | 2000-312002 A | 11/2000 |
| JP | 2004-31519 A | 1/2004 |
| JP | 2006-134947 A | 5/2006 |

* cited by examiner

*Primary Examiner* — Cuong Q Nguyen
(74) *Attorney, Agent, or Firm* — Crowell & Moring LLP

(57) ABSTRACT

In an LDMOS transistor, a channel length is reduced to increase a saturation current without causing an off-state breakdown voltage optimized in terms of trade-off between an on-resistance and the off-state breakdown voltage. A short channel region is selectively formed between an element isolation film and a low-concentration body region in which a channel is formed such that the short channel region is located immediately below a gate oxide film. The short channel region has a conduction type opposite to that of the low-concentration body region and has a carrier concentration higher than that of the low-concentration body region. The body region is retreated by the presence of the short channel region toward a high-concentration source region.

2 Claims, 6 Drawing Sheets

SEMICONDUCTOR DEVICE AND ITS MANUFACTURING METHOD

CLAIM OF PRIORITY

The present application claims priority from Japanese patent application JP 2010-044861 filed on Mar. 2, 2010, the content of which is hereby incorporated by reference into this application.

FIELD OF THE INVENTION

The present invention relates to a semiconductor device including a MOS transistor based on analog LSI technology, and more particularly, to a semiconductor device including a laterally diffused MOS transistor (hereinafter, referred to as an LDMOS transistor). More specifically, the present invention relates to a semiconductor device including a MOS transistor having a channel formed by thermal diffusion, and a method of manufacturing such a semiconductor device.

BACKGROUND OF THE INVENTION

In the technology of LDMOS transistors, it is known to define relative locations of a body region and a drift region so as to reduce on-resistance (see, for example, JP-A-2000-312002).

In the technology of LDMOS transistors, it is also known to provide two drift paths to reduce on-resistance (see, for example, JP-A-2004-031519).

In the technology of LDMOS transistors, it is known to provide a current path along a side of a channel to reduce on-resistance (see, for example, JP-A-2006-134947).

In the technology of a lateral IGBT (Insulated Gate Bipolar Transistor), it is known to define a structure of a channel region so as to increase on-current (see, for example, JP-A-Hei11 (1999)-266018).

SUMMARY OF THE INVENTION

In recent years, there has been a need for a reduction in size of an integrated circuit (IC) including a MOS transistor operable at a high voltage (100 V or higher) to drive an ultrasonic transducer in a medical device or the like. To reduce the size of such a type of IC, the MOS transistor disposed in the IC needs to have a high capacity to provide a high current in a saturation region as well as low on-resistance which has been achieved in conventional power MOS transistors.

FIG. 2 illustrates a cross section of a high-voltage MOS transistor whose channel length is defined by thermal diffusion according to a conventional technique. Referring to FIG. 2, an improvement to be achieved by the present invention is described below. In FIG. 2, the MOS transistor (P type) is formed on a semiconductor substrate (P$^{--}$ type) 2. Reference numeral 3 denotes an element isolation film (a first isolation film). Typically, an oxide film is used as the element isolation film 3 and other isolation films described below in the MOS transistor. In general, a semiconductor substrate having such an element isolation film is called an SOI (Silicon on Insulator) substrate. Reference numeral 4 denotes an element isolation film (a second isolation film), and reference numeral 5 denotes an element isolation film (a third isolation film). Unlike the element isolation film 3, there is no particular restriction on the locations of the element isolation film (the second isolation film) 4 and the element isolation film (the third isolation film) 5. The element isolation film (the second isolation film) 4 is called LOCOS (Local Oxidation of Silicon). Reference numeral 6 denotes a high-concentration drain region (P$^+$ type), and reference numeral 7 denotes a high-concentration source region (P$^+$ type). These regions 6 and 7 are formed such that they are separated by a distance required to achieve a breakdown voltage corresponding to a maximum rating. Reference numeral 8 denotes a gate oxide film, and reference numeral 9 denotes a gate electrode. The gate electrode 9 has a part extending up onto the element isolation film 4.

The conventional technique described above is characterized in the shape of a low-concentration body region (N$^-$ type) 10 in which a well and a channel of the MOS transistor are formed. To achieve a sufficiently high source-drain breakdown voltage, the carrier concentration of the region 10 needs to be sufficiently low. However, when the low-carrier-concentration region is formed, a variation in location of the low-concentration body region (N$^-$ type) 10 can occur, which leads to a variation in channel length, which in turn leads to a variation in current characteristics. A technique to avoid the above problem is to form the low-concentration body region 10 after the gate electrode 9 is formed. More specifically, the low-concentration body region 10 is formed by implanting ions using the gate electrode 9 as an implantation mask. The ion implantation energy is selected such that ions do not penetrate the gate electrode 9. After the ion implantation, a heat treatment is performed to thermally diffuse the ions to below the gate electrode 9. The thermal diffusion length defines the channel length. By employing the production method described above, it is possible to minimize the registration error between the gate electrode 9 and the low-concentration body region 10, which leads to a reduction in variation in channel length. The MOS transistor having the channel produced by performing thermal diffusion in the above-described manner is called an LDMOS (Laterally Diffused MOS) transistor.

In general, of various characteristics of LDMOS transistors, it is needed to achieve an optimal trade-off between the off-state breakdown voltage and the on-resistance. The off-state breakdown voltage refers to a source-drain breakdown voltage when the gate is in an off-state. The off-state breakdown voltage increases with increasing distance between the source and the drain. On the other hand, in the present invention, the on-resistance refers to resistance obtained in a state in which the gate is in an on-state and a voltage applied between the source and drain is within a range in which a linear characteristic is obtained. In the LDMOS structure, the on-resistance in the linear region depends on the channel resistance and the parasitic resistance in the drain region. Because the drain region occupies a much greater area of the transistor structure than the channel occupies, the on-resistance is dominated by a parasitic resistance in the drain region. Therefore, to achieve low on-resistance, it is necessary to reduce the source-drain distance (the drain region). As described above, the increase/reduction in source-drain distance results in a trade-off between the off-state breakdown voltage and the on-resistance. Conventionally, in designing of the LDMOS structure, efforts have focused on making the trade-off to achieve an ideal characteristic close to the theoretical limitation. Note that the term "on-resistance" is used herein to represent resistance calculated from a current per unit area.

In addition to the improvement in off-state breakdown voltage and on-resistance in the linear region, there is also a need for an improvement in the ability to provide a high current in the saturation region. In the case of the IC for use in driving the ultrasonic transducer described above in section BACKGROUND OF THE INVENTION, the IC needs LDMOS transistors that provide output voltages equal in magnitude but opposite in polarity. The N-type LDMOS transistor and the P-type LDMOS transistor used for this purpose need to have equal saturation current characteristics. However, in general, the P-type LDMOS transistor is lower in ability to provide a current in the saturation region than the N-type LDMOS transistor, and thus the P-type LDMOS transistor needs a greater device size to provide the required ability than the device size of the N-type LDMOS transistor. This means that the saturation current of the P-type LDMOS transistor is a main factor that determines the total chip size. Therefore, an increase in the saturation current of the P-type LDMOS transistor can lead to a reduction in total chip cost.

In the saturation region, unlike the linear region in which the resistance is substantially determined by the parasitic resistance, the saturation current is mainly determined by the channel resistance. Of various parameters, the channel length is the most significant parameter in controlling the channel resistance. The channel length of the LDMOS transistor according to the conventional technique is determined by thermal diffusion as described above, and thus a problem is that, unlike low-voltage MOS transistors, it is difficult to control the channel resistance by adjusting the length of the gate electrode.

It should be noted here that the above-described techniques disclosed in JP-A-2000-312002, JP-A-2004-031519, JP-A-2006-134947, and JP-A-Hei11 (1999)-266018) are clearly different from the present invention as described below.

In the technique of the LDMOS transistor disclosed in JP-A-2000-312002, although the body region and the drift region are formed so as to reduce the on-resistance, nothing is disclosed in terms of forming another layer corresponding to a short channel region (SC region).

In the techniques of the lateral MOS transistor, the LDMOS transistor, and the lateral IGBT disclosed in JP-A-2004-031519, JP-A-2006-134947, and JP-A-Hei11 (1999)-266018), the structure is optimized to reduce the on-resistance, and more particularly, an N layer is formed to reduce the channel length. However, nothing is disclosed anywhere in terms of a technique to increase the saturation current. That is, the concentration profile of the device according to any of these disclosed techniques is not designed to increase the saturation current, i.e., the concentration profile is not optimized from this point of view. That is, in these disclosed techniques, the reduction in the channel length is performed not to increase the saturation current but to reduce the on-resistance. Thus, the channel structure according to any of these disclosed techniques has a drawback that punch-through tends to easily occur.

In view of the above, it is an object of the present invention to provide a technique to improve the ability to provide a saturation current of an LDMOS transistor. More specifically, it is an object of the present invention to reduce a channel length to increase the saturation current without causing a reduction in an off-state breakdown voltage.

Exemplary aspects of the present invention are described below.

According to an aspect of the present invention, there is provided a semiconductor device including a semiconductor substrate and a MOS transistor of a first conduction type including a source region of the first conduction type and a drain region of the first conduction type isolated from each other by an element isolation film formed on a main surface of a semiconductor layer of the first conduction type formed on a main surface of the semiconductor substrate, wherein the MOS transistor further includes a gate oxide film and a gate electrode of the first conduction type, the gate oxide film and the gate electrode being formed between the source region and the element isolation film, the gate electrode having a part extending up onto the element isolation film, and wherein the MOS transistor further includes a body region of a second conduction type opposite to the first conduction type, the body region having a concentration gradient provided by diffusion from the source region, and wherein the MOS transistor further includes a short channel region of the first conduction type formed on the main surface of the semiconductor layer.

According to another aspect of the present invention, there is provided a method of manufacturing a semiconductor device including a semiconductor substrate and a MOS transistor formed on the semiconductor substrate, the method including the steps of preparing the semiconductor substrate, forming a semiconductor layer of a first conduction type on the semiconductor substrate, forming an element isolation film on the semiconductor layer, forming a gate oxide film of the MOS transistor, forming a gate electrode of the MOS transistor on the gate oxide film such that the gate electrode has a part extending up onto the element isolation film, forming a body region of a second conduction type opposite to the first conduction type, and forming a short channel region of the first conduction type on the semiconductor layer, wherein the method further includes the step of forming a source region of the first conduction type and a drain region of the conduction type such that the source region and the drain region are isolated from each other by the element isolation film, and wherein the step of forming the short channel region is performed after the step of forming the gate oxide film.

Thus, according to the present invention, it is possible to increase the ability to provide a high saturation current without causing degradation in characteristic in the linear region, a reduction in off-state breakdown voltage, and an increase in variation in ability to provide the saturation current.

DETAILED DESCRIPTION OF THE PREFERRED EMBODIMENTS

Figure 1:
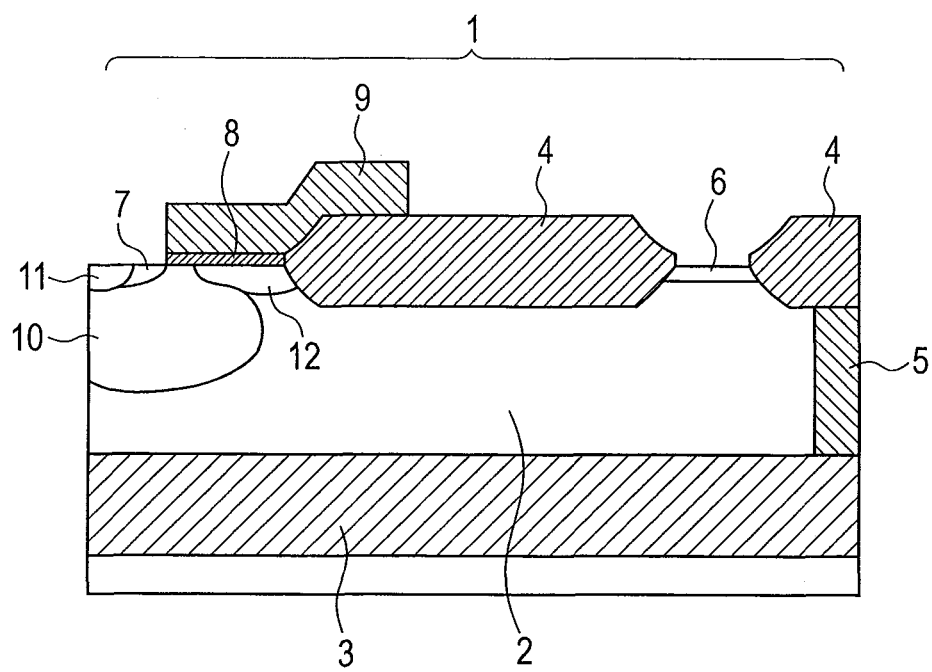
FIG. 1 is a cross-sectional view of a device according to a first embodiment of the present invention.
Figure 2:
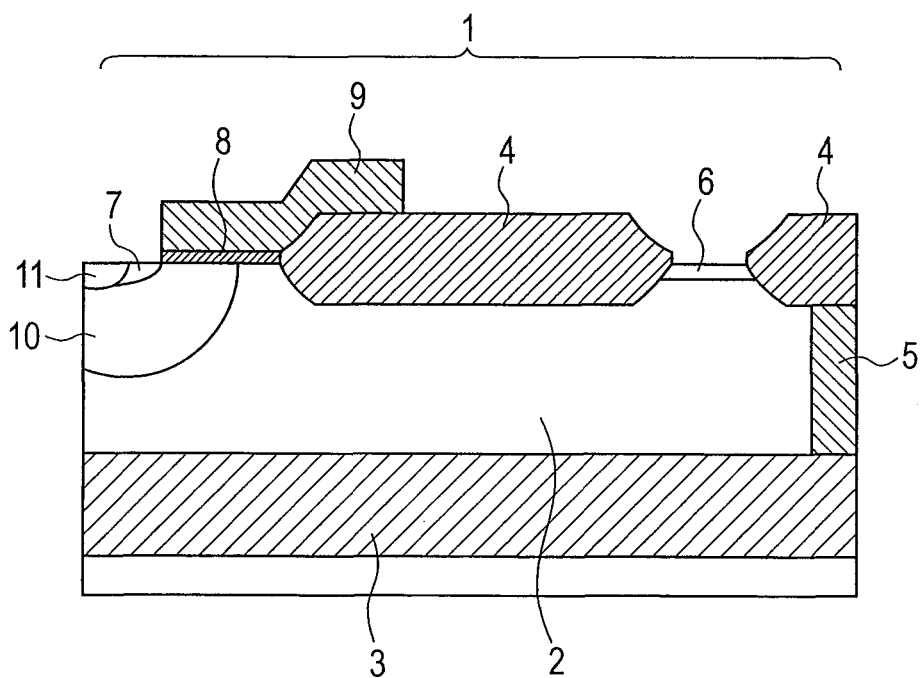
FIG. 2 is a cross-sectional view of a device according to a conventional technique.

In a semiconductor device according to the present invention, a MOS transistor of a first conduction type is formed on a main surface of a semiconductor substrate of the first conduction type such that a source and a drain of the first conduction type of the MOS transistor are isolated from each other by an element isolation film formed on a semiconductor layer of the first conduction type.

The MOS transistor includes a gate oxide film and a gate electrode of the first conduction type. The gate oxide film and the gate electrode are located between the source and the element isolation film. The gate electrode has a part extending up onto the element isolation film.

The MOS transistor further includes a body region of a second conduction type that is formed by implanting ions into the source region using the gate electrode as an implantation mask and subsequently performing thermal diffusion.

A short channel region of the first conduction type is formed on the semiconductor layer and immediately below the gate oxide film such that the body region is retreated by the short channel region toward the source region.

The semiconductor device according to the present invention is described in further detail below. The semiconductor device includes the semiconductor substrate and the MOS transistor of the first conduction type. The semiconductor layer of the first conduction type is formed on the main surface of the semiconductor substrate. The MOS transistor is formed such that the source region and the drain region both of the first conduction type are isolated from each other by the element isolation film formed on the semiconductor layer. The gate oxide film and the gate electrode of the first conduction type of the MOS transistor are formed between the source region and the element isolation film. The gate electrode is formed such that the gate electrode has the part extending up onto the element isolation film. The body region of the MOS transistor is of the second conduction type opposite to the first conduction type, and the body region has a concentration gradient provided by diffusion from the source region. The short channel region of the first conduction type is formed on the semiconductor layer.

In the semiconductor device described above, preferably, the semiconductor substrate may be of the first conduction type and the short channel region may be formed on the semiconductor layer such that the short channel region is located immediately below the gate oxide film and in a region between the source region and the element isolation film. In this case, more preferably, a drift region of the first conduction type may be formed in a portion of the semiconductor substrate such that the portion is located between the short channel region and the drain region and such that the portion extends below a part of the element isolation film in a range that does not reach the short channel region, wherein the carrier concentration of the drift region is higher than the carrier concentration of the semiconductor substrate and lower than the carrier concentration of the short channel region, In the semiconductor device described above, preferably, the semiconductor substrate may be of the second conduction type, and a drift region of the first conduction type may be formed in a portion of the semiconductor substrate such that the portion is located between the short channel region and the drain region and such that the portion extends below a part of the element isolation film in a range that does not reach the short channel region, wherein the drift region is formed such that the carrier concentration of the drift region is higher than the carrier concentration of the semiconductor substrate and lower than the carrier concentration of the short channel region, and such that the drift region is connected to the short channel region.

In the semiconductor device described above, preferably, the short channel region may be formed in a part of the drain region excluding the element isolation film. In this case, more preferably, a drift region of the first conduction type may be formed in a portion of the semiconductor substrate such that the portion is located between the short channel region and the drain region and such that the portion extends below a part of the element isolation film in a range that does not reach the short channel region, and such that the carrier concentration of the drift region is higher than the carrier concentration of the semiconductor substrate and lower than the carrier concentration of the short channel region.

The present invention also provides a method of manufacturing a semiconductor device including a semiconductor substrate and a MOS transistor formed on the semiconductor substrate. The method includes the steps of preparing the semiconductor substrate, forming a semiconductor layer of a first conduction type on the semiconductor substrate, forming an element isolation film on the semiconductor layer, forming a gate oxide film of the MOS transistor, forming a gate electrode of the MOS transistor on the gate oxide film such that the gate electrode has a part extending up onto the element isolation film, forming a body region of a second conduction type opposite to the first conduction type, and forming a short channel region of the first conduction type on the semiconductor layer. The method of manufacturing the semiconductor device further includes the step of forming a source region of the first conduction type and a drain region of the conduction type such that the source region and the drain region are isolated from each other by the element isolation film, wherein the step of forming the short channel region is performed after the step of forming the gate oxide film.

In the method, preferably, the step of forming the short channel region of the MOS transistor may be performed in common of the process of a channel implantation for forming a second MOS transistor to be finally disposed together with the former MOS transistor in the semiconductor device. Preferably, the method may further include the steps of forming a well region of the second MOS transistor after the step of forming the body region and before the step of forming short channel region, and forming a channel region of the second MOS transistor after the step of forming the short channel region.

The present invention is described in further detail below with reference to embodiments in conjunction with the accompanying drawings. In the following description, it is assumed by way of example that the LDMOS transistor is of the P type. Note that embodiments described below may be also applied to LDMOS transistors of the N type whose elements are all opposite in conduction type to those of the LDMOS transistor of the P type. It is also assumed that an SOI substrate is used as the semiconductor substrate although a bulk substrate is also usable. Furthermore, it is also assumed that LOCOS is used for the device element isolation although other structures such as STI (Shallow Trench Isolation) may be used.

First Embodiment

FIG. 1 illustrates a structure of an LDMOS transistor according to an embodiment of the present invention. In FIG. 1, a MOS transistor (P type) 1 is formed on a semiconductor substrate 2 ($P^{--}$ type). Reference numeral 3 denotes an element isolation film (SOI) (a first element isolation film), reference numeral 4 denotes an element isolation film (LOCOS) (a second element isolation film), and reference numeral 5 denotes an element isolation film (a third element isolation film). These element isolation films are for electrically isolating device elements from each other. When the voltage is in a range assumed in the present embodiment, the isolation using the element isolation films needs a less area than the isolation using PN junctions.

The MOS transistor also includes a high-concentration drain region ($P^+$ type) 6, a high-concentration source region ($P^+$ type) 7, and a gate oxide film 8. A gate electrode ($N^+$ type) 9 is formed such that at its one end, closer to the high-concentration drain region 6, the gate electrode 9 extends up onto the element isolation film 4. The forming of the gate electrode such that the gate electrode is partially located on the element isolation film 4 leads to a reduction in electric field in the region on the side of the high-concentration source region 7, which leads to an increase in off-state breakdown voltage.

Reference numeral 10 denotes a low-concentration body region ($N^-$ type) serving as a well in which a channel is formed. Reference numeral 11 denotes a power-supply-to-body region ($N^+$ type) for providing an electric potential to the body region. This region makes it possible to control the potential difference between the low-concentration body region 10 and the gate electrode 9 such that a channel is formed on the surface of the semiconductor substrate in the low-concentration body region 10. In addition to disposing the high-concentration source region 7 and the power-supply-to-body region 11 in a source-drain direction as shown in FIG. 1, the high-concentration source region 7 and the power-supply-to-body region 11 may be alternately disposed in a direction along the gate width, i.e., in a direction perpendicular to the page of the drawing.

A short channel region (P type) 12 is formed between the low-concentration body region 10 and the element isolation film 4 and immediately below the gate oxide film 8. Hereinafter, the short channel region will be referred to as the SC region. Note that the low-concentration body region 10 is formed such that the low-concentration body region 10 protrudes into a region below the SC region.

The source-drain distance of the LDMOS transistor 1 is optimized by properly adjusting the length of a drain part (drift region) formed by the semiconductor substrate 2 and the element isolation film 4. As preconditions for this, it is necessary that the carrier concentration of the semiconductor substrate 2 is sufficiently low so that when a voltage is applied between the source and the drain, a depletion layer formed at a PN-junction between the low-concentration body region 10 and the semiconductor substrate 2 extends to reach the high-concentration drain region 6 whereby the voltage applied between the source and the drain does not concentrate on the PN junction but the voltage is uniformly distributed between the body region 10 and the high-concentration drain region 6. This allows a great increase in breakdown voltage. The breakdown voltage can be controlled by adjusting the length of the drift region. This effect of increasing the breakdown voltage is referred to as a RESURF effect. However, the increase in the drift region results in an increase in the on-resistance caused by parasitic resistance of the drift region. In view of the above, the drift region is set to be short depending on the rated voltage.

In the low-concentration body region, the P-type carrier concentration is set to be lower than a particular value so that the RESURF effect described above can be achieved. However, if the carrier concentration is set to be extremely low, punch-through can occur between the high-concentration source region 7 and the semiconductor substrate 2, which creates a short circuit path between the high-concentration source region 7 and the semiconductor substrate 2.

Figure 3:
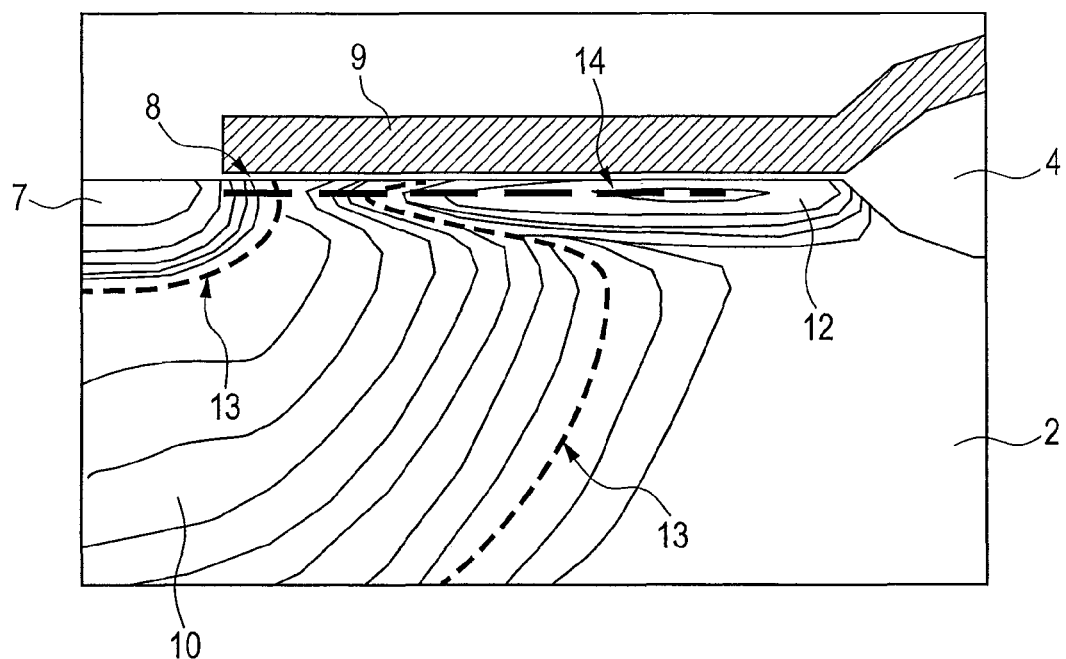
FIG. 3 is a diagram illustrating in further detail a part of the device shown in FIG. 2.
Figure 4:
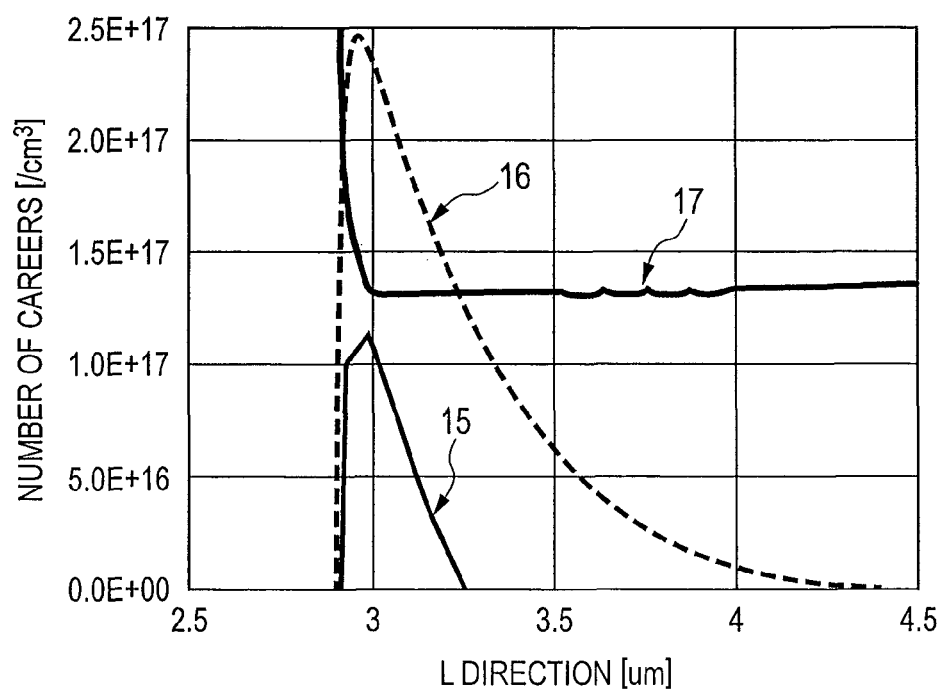
FIG. 4 illustrates an one-dimensional profile of a region represented by a broken line 14 in FIG. 3.

To reduce the channel length according to the present embodiment of the invention, the low-concentration body region 10 is retreated by the SC region toward the source only in its part located immediately below the gate oxide film 8. FIG. 3 illustrates in detail a carrier concentration profile in the source region and the SC region shown in FIG. 1. In FIG. 3, N/P-type carrier concentrations are represented by solid contour lines, and PN junctions are represented by broken lines 13. FIG. 4 illustrates an one-dimensional carrier concentration distribution in a channel region indicated by a broken line 14 shown in FIG. 3. In FIG. 4, for the purpose of comparison, a result is also shown for a case where there is no SC region. More specifically, a solid line 15 indicates an N-type carrier profile for a case where there is SC region, while a broken line 16 indices an N-type carrier profile for a case where there is no SC region. The width of a peak of each curve, as measured at a concentration level close to 0, defines the channel length. As can be seen, the provision of the SC region leads to a reduction in the channel length to about one third of that obtained when there is no SC region. This reduction in the channel length is achieved as a result of cancellation of the N-type carrier profile in the body region 16 by the P-type carrier profile of the SC region represented by a solid line 17 in FIG. 4. The reduction in channel length to ⅓ substantially provides a reduction in channel resistance to ⅓. In practical devices actually produced, an increase in saturation current by about 25% was observed.

In the present embodiment of the invention, no SC region is formed in the drain part (the drift region) formed by the semiconductor substrate 2 and the element isolation film 4. If an SC region is formed in the drift region, the low-concentration body region 10 is canceled out by the SC region, which eliminates the RESURF effect that can be achieved by optimizing the high carrier concentration provided to achieve the short channel. Therefore, the SC region needs to be formed only in a minimum necessary area that allows a reduction in channel length in the low-concentration body region such that the total carrier concentration optimized in terms of the trade-off between the off-state breakdown voltage and the on-resistance is not significantly influenced by the provision of the SC region.

Second Embodiment

Figure 5:
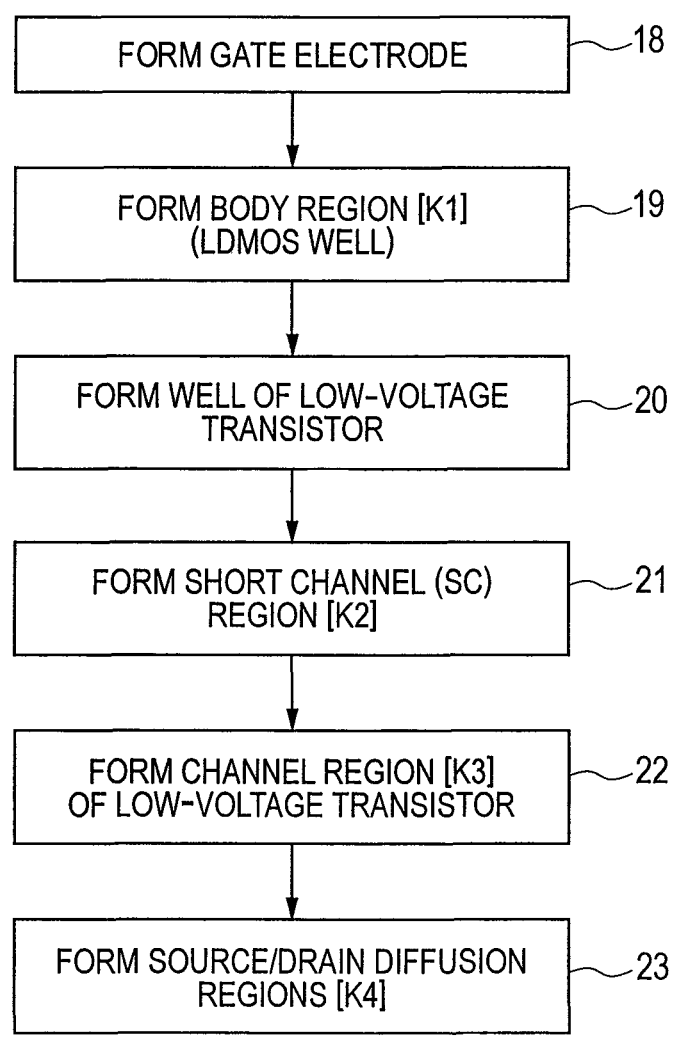
FIG. 5 is a flow chart illustrating part of a production process according to a second embodiment of the present invention.

Referring to FIG. 5, a second embodiment of the present invention is described below. FIG. 5 illustrates part of a production process according to the second embodiment of the invention. The production process makes it possible to produce the LDMOS transistor structure according to the first embodiment described above using a minimum number of masks via a minimum number of production steps. The present production process may be employed to simultaneously produce both a high-voltage LDMOS transistor and a low-voltage transistor via the same process.

In step 18, a gate electrode is produced. Note that a gate oxide film has already been formed before step 18. In step 19, a body region serving as a channel is formed. Ions are implanted into a channel region using a mask. After the implantation, a heat treatment is performed to diffuse the implanted ions. In this ion implantation step, the ion implantation energy is set such that ions do not penetrate the gate electrode formed in step 18. The pattern of the mask used in the ion implantation is determined so that the ion implantation area partially overlaps the gate electrode. Note that a channel-side edge of the body region is defined not by the mask but by the gate electrode formed in step 18. In this method, no registration error occurs between the mask and the gate electrode, which leads to a reduction in variation of the channel length of the produced LDMOS structure.

In step 20, a well region of a low-voltage transistor is formed. More specifically, ions are implanted using a mask into a region in which the low-voltage transistor is to be formed. After the ion implantation, a heat treatment is performed. Note that the heat treatment time in the previous step 19 is determined taking into account the heat treatment performed in step 20. Subsequently, an SC region is formed in step 21, and a channel region of the low-voltage transistor is formed in step 22. Thereafter, source/drain diffusion regions are formed in step 23. To form the source/drain diffusion regions in this step, a heat treatment is performed at a high temperature in a short time. In the process of forming the SC region in step 21 described above, the ion implantation energy is set such that ions penetrate the gate electrode formed in step 18 whereby the region is formed at the particular location described above with reference to the first embodiment, i.e., immediately below the gate oxide film.

It is difficult to achieve the implantation profile of the short channel according to the first embodiment described above unless the process according to the second embodiment is used. For example, in a case where the short channel is formed by performing a heat treatment for a short time in the step of forming the body region, the diffusion length also becomes short in a region deeper than the channel formed on the semiconductor surface, and thus the resultant structure has a drawback that punch-through tends to easily occur between the high-concentration source region and the semiconductor substrate. Furthermore, the channel length is very sensitive to variations in heat treatment conditions, which results in a variation in saturation current. In another method of forming the channel region, the channel region is formed using a mask before the gate is formed. However, in this method, a combination of a registration error of the mask used in the channel formation and a registration error of the mask used in the gate formation has a synergistic effect to produce a large variation in channel length, which results in a large variation in saturation current. Furthermore, as in the process in which the heat treatment is performed for a short time, it is difficult to achieve a structure in which no punch-through occurs.

Third Embodiment

Figure 6:
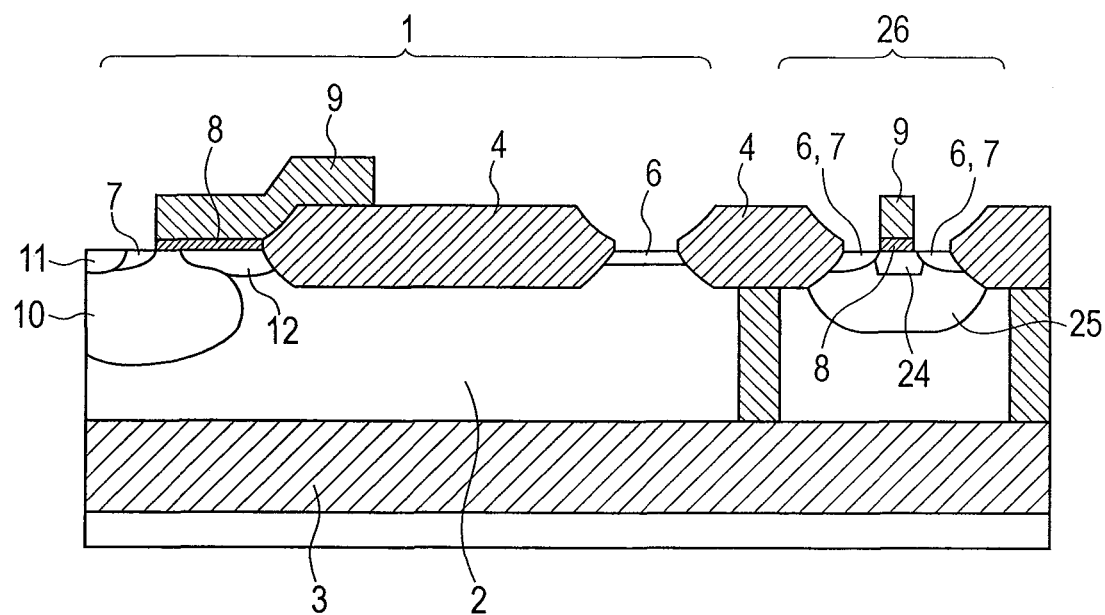
FIG. 6 is a cross-sectional view of a device according to a third embodiment of the present invention.

Referring to FIG. 6, a third embodiment of the present invention is described below. In FIG. 6, a MOS transistor (P type) 1 and a low-voltage MOS transistor (P type) 26 are formed on a semiconductor substrate ($P^{--}$ type) 2. In FIG. 6, reference numeral 3 denotes an element isolation film (SOI) (a first element isolation film), reference numeral 4 denotes an element isolation film (LOCOS) (a second element isolation film), and reference numeral 5 denotes an element isolation film (a third element isolation film). Reference numeral 6 denotes a high-concentration drain region ($P^+$ type) 6, and reference numeral 7 denotes a high-concentration source region ($P^+$ type). Reference numeral 8 denotes a gate oxide film 8. The high-concentration drain region 6 and the source region 7 in the MOS transistor (P type) 1 are different in structure. In the low-voltage MOS transistor (P type) 26, unlike the MOS transistor (P type) 1, the drain region and the source region are similar in structure.

A gate electrode ($N^+$ type) 9 of the MOS transistor (P type) 1 is formed such that at its one end, closer to the high-concentration drain region 6, the gate electrode 9 extends up onto the element isolation film 4. On the other hand, in the low-voltage MOS transistor (P type) 14, the size of a gate electrode is determined by the channel length.

Reference numeral 10 denotes a low-concentration body region ($N^-$ type) in which a well and a channel of the MOS transistor (P type) 1 are formed. Reference numeral 11 denotes a power-supply-to-body region ($N^+$ type) for providing an electric potential to the body region. Reference numeral 25 denotes a well in which the low-voltage MOS transistor (P type) 26 is formed.

In the MOS transistor (P type) 1, an SC region (P type) 12 is formed between the low-concentration body region 10 and the element isolation film 4 and immediately below the gate oxide film 8. Note that the low-concentration body region 10 is formed such that the low-concentration body region 10 protrudes into a region below the SC region.

Reference numeral 24 denotes a channel region of the low-voltage MOS transistor (P type) 26.

In the present embodiment, as shown in FIG. 6, the MOS transistor (P type) 1 according to the first embodiment described above and the low-voltage MOS transistor (P type) 26 are formed on the same semiconductor substrate. Furthermore, in the present embodiment, when the SC region 12 for increasing the saturation current of the MOS transistor 1 is produced, the channel region 24 of the low-voltage MOS transistor is also produced at the same time.

As described above, the present embodiment of the invention provides the advantage that the saturation current of the MOS transistor 1 can be increased without increasing production cost. Compared with the second embodiment, steps 21 and step 22 are combined into a signal step, and thus one step is eliminated. The present embodiment is also advantageously applicable to a production of a combination of a MOS transistor (N type) and a low-voltage MOS transistor (N type).

Fourth Embodiment

Figure 7:
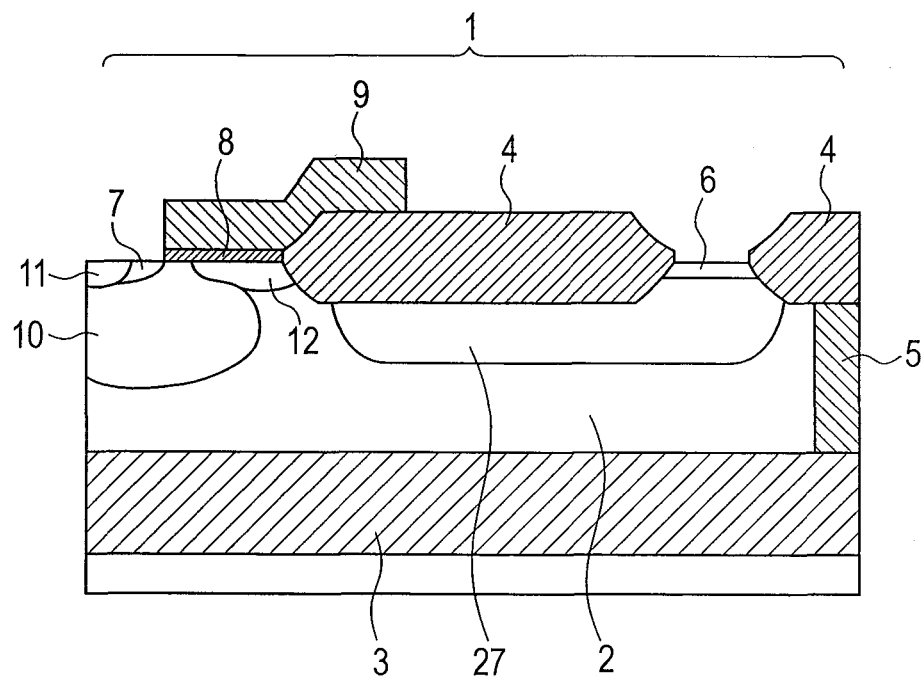
FIG. 7 is a cross-sectional view of a device according to a fourth embodiment of the present invention.

Referring to FIG. 7, a fourth embodiment of the present invention is described below. In FIG. 7, elements 1 to 12 are similar to those in the first embodiment described above. The fourth embodiment is different from the first embodiment in that the carrier concentration of the semiconductor substrate 2 is set to be lower than that in the first embodiment, and a drift region ($P^-$) 27 is added. The total carrier concentration of the drift region 27 and the semiconductor substrate 2 is set to be equal to the carrier concentration of the semiconductor substrate 2 in the first embodiment. The maximum breakdown voltage obtained by the RESURF effect is determined by the total carrier concentration for the same size, and thus the addition of the drift region ($P^-$) 27 does not cause a change in the RESURF effect. On the other hand, the current flows not through the whole drift region but through a path immediately below the element isolation film 4 in a concentrated manner, and thus it is possible to reduce the parasitic resistance by increasing the carrier concentration in this path. This allows an improvement in trade-off between the off-state breakdown voltage and the on-resistance. The RESURF effect makes the electric field substantially uniform between the source and the drain. However, at edges of the source and drain, the electric field strength tends to increase. In view of the above, the drift region 27 is formed to adjust the carrier concentration in the region between the high-concentration drain region 6 and the semiconductor substrate 2 so that the increase in electric field strength at the edge of the high-concentration drain region 6 is eased thereby achieving an increase in breakdown voltage. To avoid the influence on the channel, the drift region 27 is formed such that the drift region 27 does not reach the gate oxide film 8. This prevents the drift region 27 from having an influence on the SC region 12 that provides the increase in saturation current.

Fifth Embodiment

Figure 8:
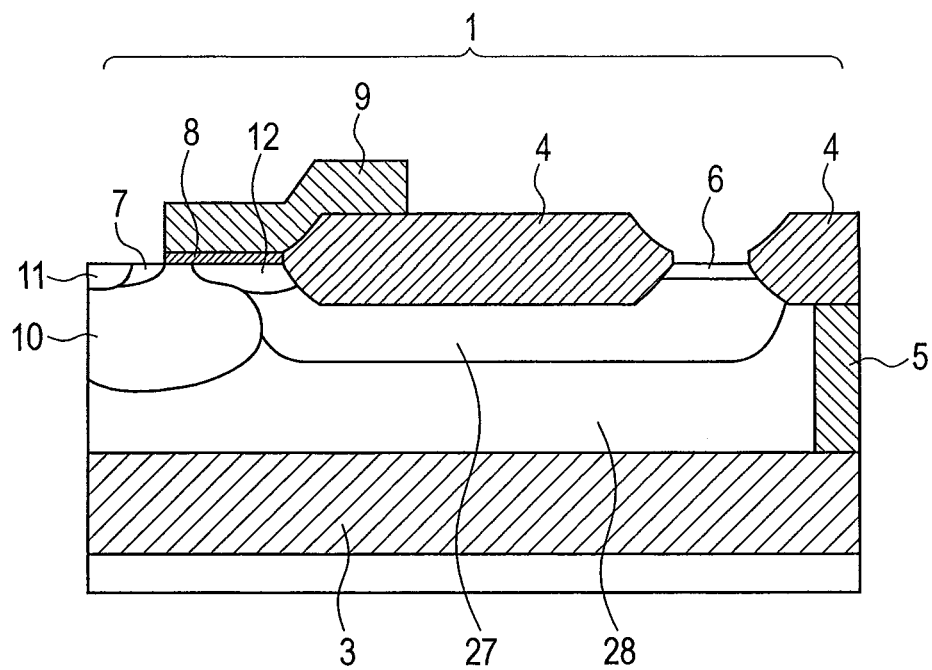
FIG. 8 is a cross-sectional view of a device according to a fifth embodiment of the present invention.

Referring to FIG. 8, a fifth embodiment of the present invention is described below. In the fifth embodiment, elements 1 and 3 to 12 are similar to those in the fourth embodiment. However, in the fifth embodiment, a semiconductor substrate 28 is of the N type opposite to that of the semiconductor substrate 2. Another difference is that the drift region 27 is formed such that its edge on the side of the high-concentration source region 7 is in contact with the low-concentration body region 10.

In the case of the LDMOS transistor according to the first embodiment described above, the semiconductor substrate is partially used as the drift region that is a part of the drain. Therefore, in the case where both N-type and P-type LDMOS transistors are formed on the same semiconductor substrate, the conduction type of the drain is opposite to the conduction type of the semiconductor substrate for either the N-type LDMOS transistor or the P-type LDMOS transistor. Thus, for an LDMOS transistor that is opposite in conduction type to the semiconductor substrate, the drift region similar to that according to the fourth embodiment is formed such that the drift region is connected to the SC region and is contact with the low-concentration body region so that the transistor can turn on when the channel is inverted. Note that the drift region is necessary to allow the transistor to turn on regardless of whether the effect similar to that obtained in the fourth embodiment is pursued.

In this case, the concentration of the drift region 27 is adjusted such that a best trade-off is achieved between the off-state breakdown voltage and the on-resistance. In the adjustment of the concentration of the drift region 27, the SC region 12 provided to increase the saturation current is not influenced, because the concentration of the SC region 12 is higher than that of the drift region 27.

As described above, the present embodiment makes it possible to form both N-type and P-type LDMOS transistors with high saturation currents on the same semiconductor substrate that is of either P type or N type.

Sixth Embodiment

Figure 9:
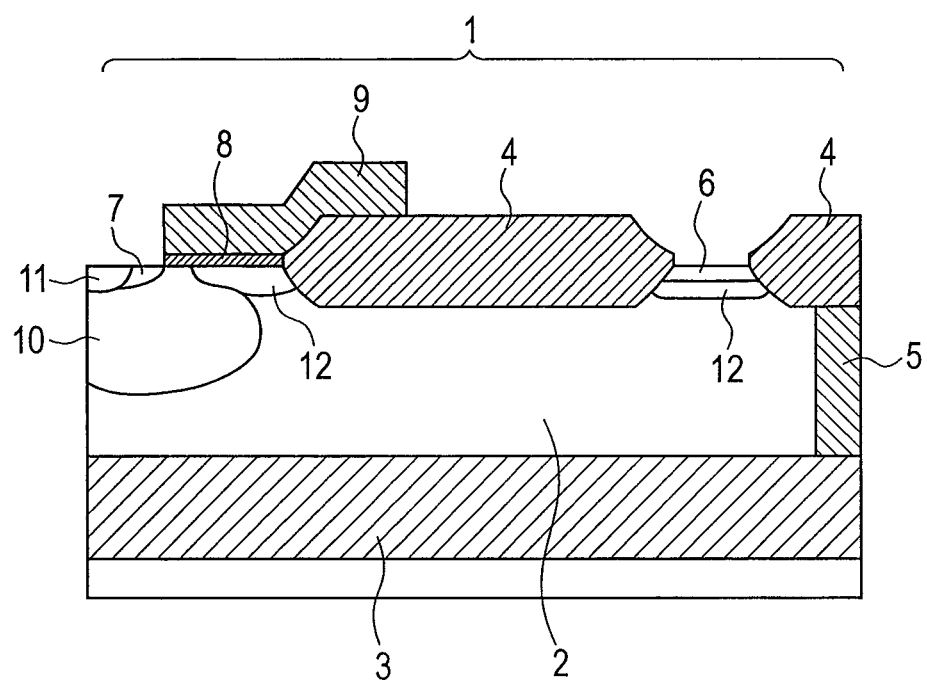
FIG. 9 is a cross-sectional view of a device according to a sixth embodiment of the present invention.

Referring to FIG. 9, a sixth embodiment of the present invention is described below. The sixth embodiment is similar to the first embodiment in terms of elements 1 to 11 but different in that the SC region 12 is formed such that the high-concentration drain region 6 is covered with the SC region 12. Note that no SC region is formed below the element isolation film 4 located below the high-concentration source region 7 and the high-concentration drain region 6.

The present embodiment provides an advantage that by forming the SC region not only in the region immediately below the gate oxide film but also in the high-concentration drain region, the off-state breakdown voltage can be increased without needing an additional processing step. The additional SC region provides an effect similar to that provided by the drift region 27 according to the fourth embodiment described above. That is, the increase in electric field strength at the edge of the drain is eased by the SC region 12 having a carrier concentration between the carrier concentrations of the high-concentration drain region 6 and the semiconductor substrate 2. The SC region 12 has a higher concentration than the concentration of the drift region 27 employed in the fourth embodiment. If such an SC region is disposed below the LOCOS located between the source and drain, the result is an increase in total carrier concentration, which causes the RESURF effect to be lost. In view of the above, the SC region 12 is not formed below the LOCOS but is limited to a small area covering the high-concentration drain region thereby achieving the improvement in the off-state breakdown voltage without creating a drawback.

Seventh Embodiment

Figure 10:
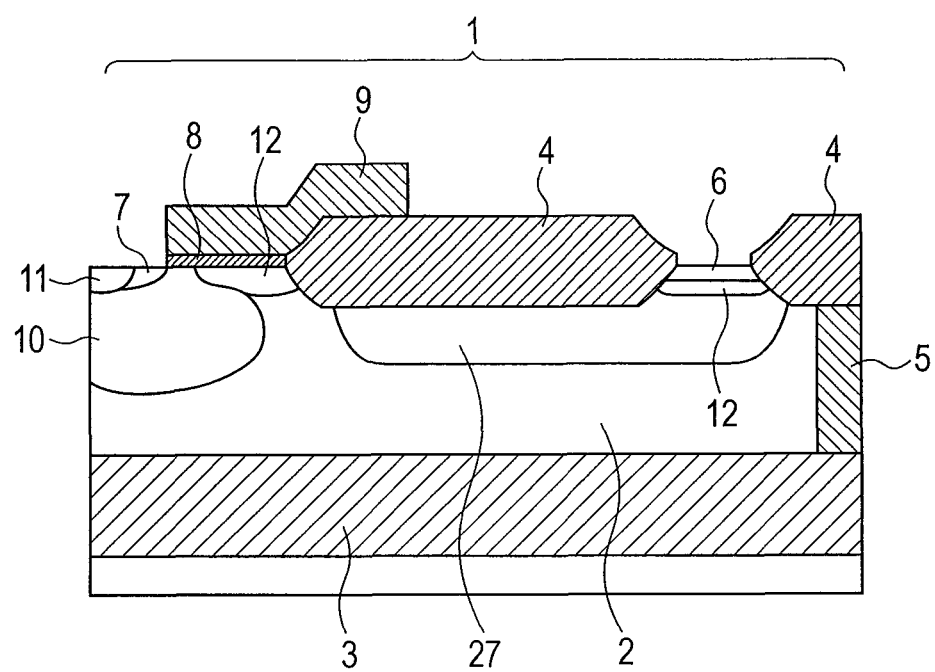
FIG. 10 is a cross-sectional view of a device according to a seventh embodiment of the present invention.

Referring to FIG. 10, a seventh embodiment of the present invention is described below. The seventh embodiment is a combination of the fourth embodiment and the sixth embodiment described above. More specifically, the drift region (P$^-$) 27 is added to the structure according to the first embodiment to reduce the parasitic resistance in the path immediately below the LOCOS between the source and the drain thereby reducing the on-resistance, and furthermore, the SC region 12 is added such that the high-concentration drift region 6 is covered with the added SC region 12 to increase the off-state breakdown voltage by the reduction in the electric field strength. Thus, the trade-off between the off-state breakdown voltage and the on-resistance can be improved while maintaining the improved saturation current.

What is claimed is:

1. A semiconductor device comprising:
a semiconductor substrate; and
a MOS transistor of a first conduction type including a source region of the first conduction type and a drain region of the first conduction type isolated from each other by an element isolation film formed on a semiconductor layer of the first conduction type formed on a main surface of the semiconductor substrate, the MOS transistor further including:
a gate oxide film and a gate electrode of a second conduction type opposite to the first conduction type, the gate oxide film and the gate electrode being formed between the source region and the element isolation film, the gate electrode having a part extending up onto the element isolation film;
a body region of the second conduction type, the body region having a concentration gradient provided by diffusion from the source region, and
a short channel region of the first conduction type formed on the semiconductor layer.

2. The semiconductor device according to claim 1, wherein the short channel region is formed in a part of the drain region excluding the element isolation film.

* * * * *